United States Patent
Tan et al.

[11] Patent Number: 6,048,399
[45] Date of Patent: Apr. 11, 2000

[54] SOG COATER NOZZLE POT

[75] Inventors: En-Tien Tan, Hsinchu; Ming-Che Yang, Kaohsiung; Kuo-Feng Huang, Chu-Pei; Ching-Chih Cheng, Hsinchu Hsien, all of Taiwan

[73] Assignee: United Microelectronics Corp., Hsinchu, Taiwan

[21] Appl. No.: 09/082,949

[22] Filed: May 21, 1998

[30] Foreign Application Priority Data

Apr. 3, 1998 [TW] Taiwan ................................. 87205033

[51] Int. Cl.⁷ ........................... B05C 11/02; B05D 3/12
[52] U.S. Cl. ........................... 118/320; 118/52; 427/240
[58] Field of Search ........................... 427/240; 118/52, 118/300, 320, 302

[56] References Cited

U.S. PATENT DOCUMENTS

| | | | |
|---|---|---|---|
| 5,405,443 | 4/1995 | Akimoto et al. | 118/668 |
| 5,562,772 | 10/1996 | Neoh | 118/52 |
| 5,763,329 | 6/1998 | Kariya | 438/780 |
| 5,788,773 | 8/1998 | Okuda et al. | 118/319 |

*Primary Examiner*—Shrive Beck
*Assistant Examiner*—Jennifer Calcagni
*Attorney, Agent, or Firm*—Thomas, Kayden, Horstemeyer & Risley

[57] ABSTRACT

A SOG coater nozzle pot includes a pot for containing fluid and letting the fluid in the pot flow out, a funneled nozzle including a wider opening for receiving fluid from the pot and a narrower opening on a protuberance inserted into a duct, and a mounting device for mounting the funneled nozzle on the SOG coater. The nozzle pot according to the invention makes the mounting/dismounting operations of the pot more convenient and less time-consuming. The stability of the SOG coater is maintained as well.

13 Claims, 3 Drawing Sheets

6,048,399

SOG COATER NOZZLE POT

CROSS-REFERENCE TO RELATED APPLICATION

This application claims the priority benefit of Taiwan application serial no. 87205033, filed Apr. 3, 1998, the full disclosure of which is incorporated herein by reference.

BACKGROUND OF THE INVENTION

1. Field of the Invention

This invention relates to a device for a spin-on glass (SOG) coater, and more particularly, to a SOG coater nozzle pot.

2. Description of Related Art

FIG. 1 shows a conventional SOG coater nozzle pot. One side of the pot 10 has two holes used to mount the pot 10 on a SOG coater by a set of screws 13 and a connecting pad 12. Another set of screws 14 is also used to mount the pot 10 on the SOG coater. The fluid ducts 16 are attached to the pot 10 by another set of screws. Thus, a conventional nozzle pot needs at least six screws for mounting various elements.

The fluid in the pot 10 flows out from the duct 11 and is sprayed on a wafer on the SOG coater through the duct 16.

In the case that the pot 10 has to be dismounted from the SOG coater for a purpose such as refilling the fluid, screws 13, 14 and 15 have to be unscrewed. Since it takes a while to unscrew the screws 13, 14, and 15, any remaining fluid in the pot 10 may turn into crystals after exposure to the air for a certain period of time. This will affect the flux of the fluid.

Furthermore, there are too many contact points between a conventional nozzle pot 10 and a SOG coater, so it is very difficult to prevent the settings of a SOG coater, such as the level setting, from changing during pot removal and mounting. This means a SOG coater has to be re-calibrated every time a pot 10 is dismounted from and mounted back on the SOG coater.

According to the foregoing, a conventional nozzle pot has drawbacks including the need of a time-consuming dismounting and mounting process, the potential crystallization of remaining fluid after the dismounting and mounting process, and the settings of a SOG coater are easily changed during the dismounting and mounting process.

SUMMARY OF THE INVENTION

It is therefore an objective of the present invention to provide a SOG coater nozzle pot that simplifies the mounting method in order to shorten the time needed for the dismounting and mounting process.

It is another objective of the present invention to provide a SOG coater nozzle pot that has a nozzle and a pot individually mounted on the SOG, so that the settings of a SOG coater, such as level setting, are protected from change due to the vibration generated by replacing the pot.

In accordance with the foregoing and other objectives of the present invention, the invention provides a SOG coater nozzle pot including a pot for containing fluid in which the contained fluid can flow through the pot and a nozzle that includes a wider and a narrower opening. The wider opening is connected to the pot, and the narrower opening is connected to a duct through which the fluid flows out. The SOG coater nozzle pot is further mounted on a SOG coater by a mounting device. In the presence of the mounting device, the time needed for dismounting and mounting the nozzle pot is reduced, and the settings of the SOG coater, such as level setting, won't be affected.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
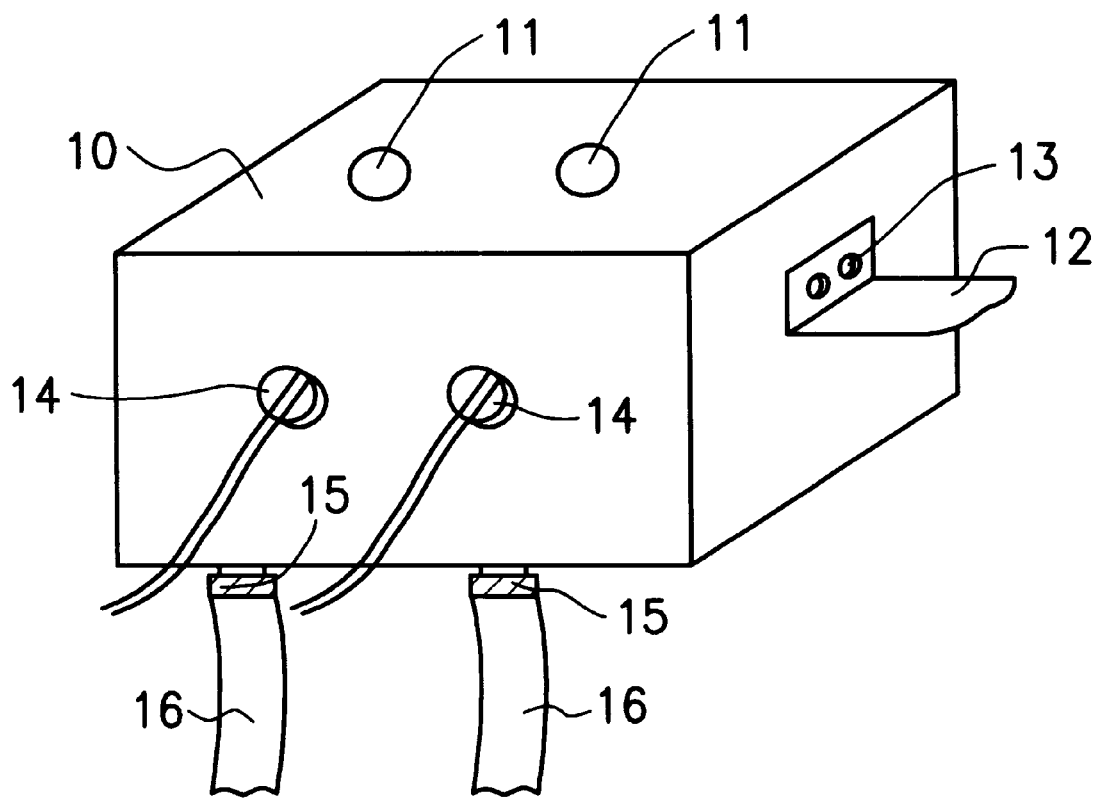
FIG. 1 is a structural diagram showing a conventional SOG coater nozzle pot.
Figure 2:
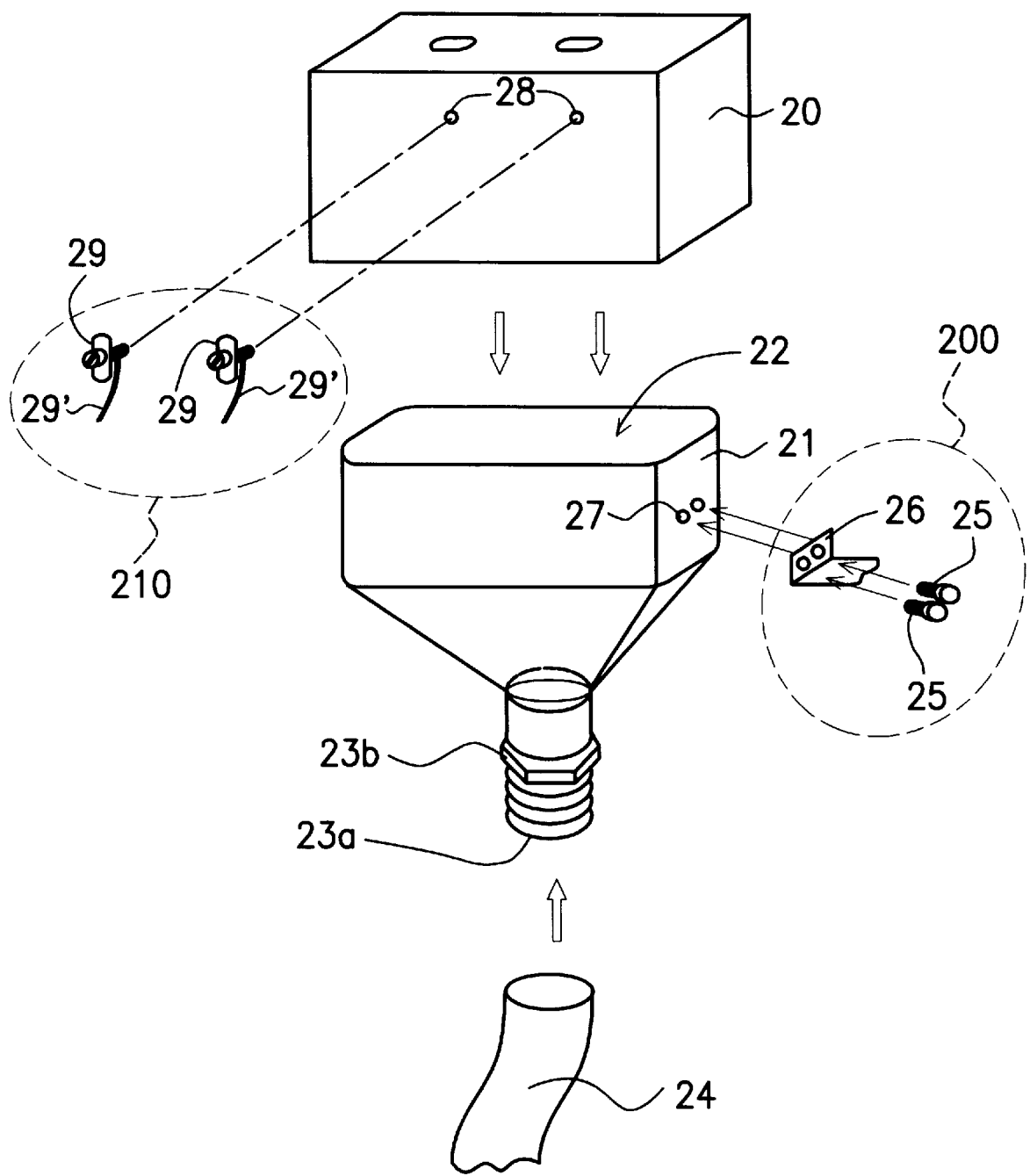
FIG. 2 is a structural diagram showing a SOG coater nozzle pot of a preferred embodiment according to the invention.

FIG. 2 shows a structural diagram of a SOG coater nozzle pot in a preferred embodiment according to the invention. The shown nozzle pot sprays fluid on a wafer deposited on the SOG coater. The nozzle pot includes a pot 20 for containing chemical fluid, which can flow through the pot 20, a funneled nozzle 21 including a wider opening 22 and a narrower opening 23a, a protuberance 23b, and a mounting device 200 for mounting the funneled nozzle 21 onto a SOG coater. The wider opening is used to receive fluid from the pot 20, and the narrower opening 23a is on one end of the protuberance 23b inserted into a duct 24, so that the contained chemical fluid can flow outward through the duct 24.

The foregoing mounting device 200 includes a set of screws 25 and an L-shape connecting pad 26. The screws 25 are screwed on the holes 27 of the funneled nozzle 21 for mounting the nozzle pot on the SOG coater.

On one side of the pot 20 there are two holes 28 used to connect the pot 10 and a SOG coater by two screws 29 and connecting lines 29', wherein the holes 28, screws 29, and connecting lines 29' form another mounting device 210.

Figure 3A:
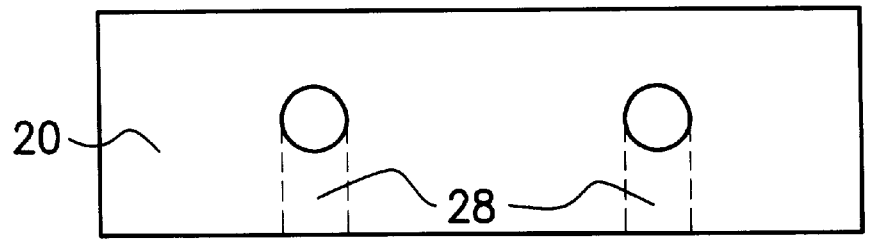
FIG. 3A is a top-view diagram showing a pot of the SOG coater nozzle pot according to the invention.
Figure 3B:
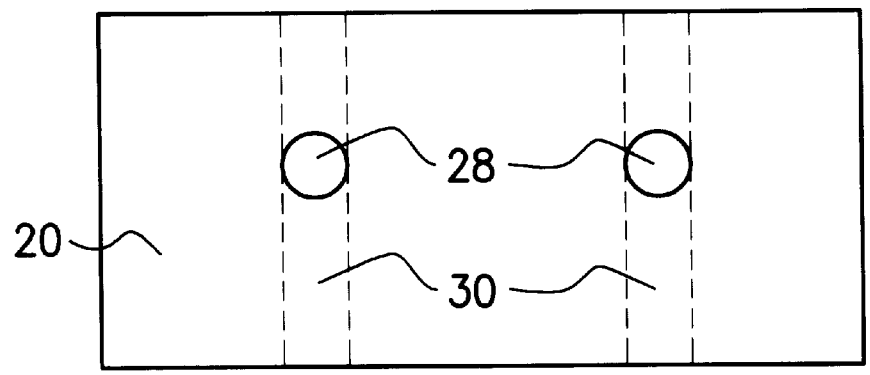
FIG. 3B is a front-view diagram showing a pot of the SOG coater nozzle pot according to the invention.
Figure 3C:
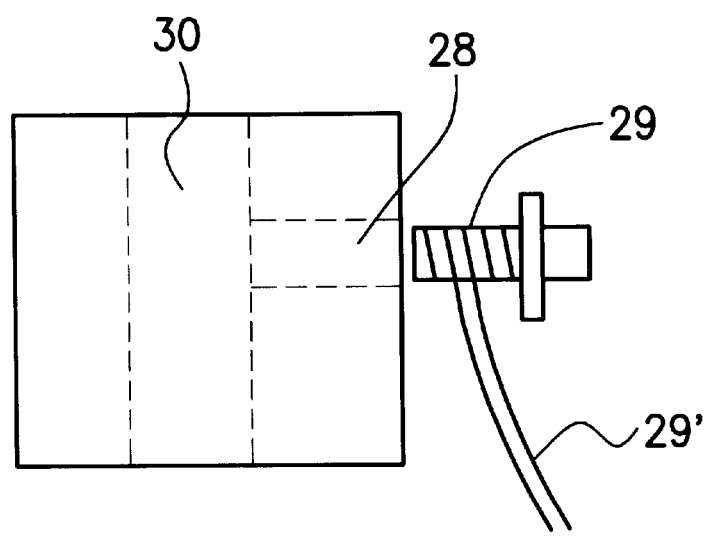
FIG. 3C is a side-view diagram showing a pot of the DOG coater nozzle pot according to the invention

FIGS. 3A through 3C are diagrams that show the top view, front view, and side view.

The pot 20 has a duct 30 through which fluid flows, and is connected to a SOG coater by a mounting device 210 including a set of screws 29, holes 28 and connecting lines 29'.

Referring to FIG. 2 again, mounting/dismounting operations of the invention are shown.

When the pot 20 is running out of fluid, it can be dismounted from a SOG coater for refilling by just unscrewing screws 29. The dismounting operation of the pot 20 doesn't affect the stability of the SOG coater and the funneled nozzle because the funneled nozzle is mounted on the SOG coater by another mounting device 200, including a set of screws 25 and a L-shape connecting pad.

Compared with a conventional SOG coater nozzle pot, the invention can achieve the same goal by just unscrewing or re-screwing two screws in a process that is more convenient and less time-consuming.

Therefore, it is a characteristic of the invention that the mounting/dismounting operations are more convenient and less time-consuming because they can be accomplished by just unscrewing or re-screwing two screws.

It is another characteristic of the invention to have a funnel-shaped nozzle and a pot that are individually mounted on a SOG coater. The stability of the SOG coater and the connection between the funneled nozzle and the SOG coater are not affected by the dismounting/mounting operations of the pot.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A SOG coater nozzle pot, comprising:
    a pot, for containing a fluid;
    a nozzle, comprising a wider opening, a narrower opening and a protuberance, wherein the wider opening is in communication with the pot and is used to receive fluid from the pot, the narrower opening is on an end of the protuberance inserted into a duct, and the fluid is allowed to flow outward through the wider opening, the narrower opening, and the duct; and
    a mounting device, for mounting the nozzle on the SOG coater;
    wherein the pot is mounted on the SOG coater independent of the nozzle.

2. The nozzle pot of claim 1, wherein the nozzle has a funneled shape.

3. The nozzle pot of claim 1, wherein the pot has at least two ducts for guiding the fluid flow into and out of the pot.

4. The nozzle pot of claim 1, wherein the mounting device comprises a set of screws and a connecting pad.

5. The nozzle pot of claim 1, wherein the narrower opening is inserted into a duct guiding the fluid from the pot to flow outward.

6. A SOG coater nozzle pot, comprising:
    a pot, for containing a fluid and letting the fluid therein flow out;
    a nozzle, having a wider opening, a narrower opening, and a protuberance, wherein the wider opening is in communication with the pot and is used to receive fluid from the pot, and the narrower opening is on an end of the protuberance inserted into a duct for letting the fluid flow outward;
    a first mounting device, for mounting the nozzle on the SOG coater; and
    a second mounting device, for mounting the pot on the SOG coater;
    wherein said nozzle is mounted on said SOG coater independent of said pot.

7. The nozzle pot of claim 6, wherein the pot has at least two ducts internally passing through the pot.

8. The nozzle pot of claim 6, wherein the first mounting device comprises a set of screws and a connecting pad for mounting the nozzle on the SOG coater.

9. The nozzle pot of claim 6, wherein the second mounting device comprises a set of screws and connecting lines for mounting the pot on the SOG coater.

10. A SOG coater nozzle pot, comprising:
    a pot for containing a fluid; and
    a nozzle, comprising a wider opening, a narrower opening and a protuberance, wherein the wider opening is in communication with the pot and is used to receive fluid from the pot, the narrower opening is on an end of the protuberance inserted into a duct, and the fluid is allowed to flow outward through the wider opening, the narrower opening, and the duct, wherein the nozzle and the pot are individually mounted on the SOG coater.

11. The nozzle pot of claim 10, wherein the nozzle has a funneled shape.

12. The nozzle pot of claim 10, wherein the pot has at least two ducts for guiding the fluid flow into and out of the pot.

13. The nozzle pot of claim 10, wherein the narrower opening is on the end of the protuberance inserted into a duct guiding the fluid from the pot to flow outward.

* * * * *